US008124957B2

(12) United States Patent
Ibbetson et al.

(10) Patent No.: US 8,124,957 B2
(45) Date of Patent: Feb. 28, 2012

(54) LOW RESISTANCE TUNNEL JUNCTIONS IN WIDE BAND GAP MATERIALS AND METHOD OF MAKING SAME

(75) Inventors: James P. Ibbetson, Santa Barbara, CA (US); Bernd P. Keller, Santa Barbara, CA (US); Umesh K. Mishra, Montecito, CA (US)

(73) Assignee: Cree, Inc., Goleta, CA (US)

( * ) Notice: Subject to any disclaimer, the term of this patent is extended or adjusted under 35 U.S.C. 154(b) by 652 days.

(21) Appl. No.: 11/360,166

(22) Filed: Feb. 22, 2006

(65) Prior Publication Data

US 2007/0194300 A1    Aug. 23, 2007

(51) Int. Cl.
H01L 29/06 (2006.01)
(52) U.S. Cl. ........................ 257/12; 257/13
(58) Field of Classification Search ........ 257/12–13
See application file for complete search history.

(56) References Cited

U.S. PATENT DOCUMENTS

| | | | | |
|---|---|---|---|---|
| 4,198,644 A | | 4/1980 | Esaki | 357/12 |
| 4,918,497 A | | 4/1990 | Edmond | 357/17 |
| 5,027,168 A | | 6/1991 | Edmond | 357/17 |
| 5,166,761 A | * | 11/1992 | Olson et al. | 257/46 |
| 5,338,944 A | | 8/1994 | Edmond et al. | 257/76 |
| 5,679,963 A | | 10/1997 | Klem et al. | 257/46 |
| 5,813,753 A | | 9/1998 | Vriens et al. | 362/293 |
| 6,369,403 B1 | | 4/2002 | Holonyak, Jr. | 257/13 |
| 6,420,736 B1 | | 7/2002 | Chen et al. | 257/99 |
| 6,515,308 B1 | | 2/2003 | Kneissl et al. | 257/86 |
| 6,515,313 B1 | | 2/2003 | Ibbetson et al. | 257/103 |
| 6,526,082 B1 | | 2/2003 | Corzine et al. | 372/46.01 |
| 6,576,488 B2 | | 6/2003 | Collins, III et al. | 438/29 |
| 6,642,652 B2 | | 11/2003 | Collins, III et al. | 313/512 |
| 6,650,044 B1 | | 11/2003 | Lowery | 313/502 |
| 6,878,563 B2 | | 4/2005 | Bader et al. | 438/22 |
| 7,816,705 B2 | | 10/2010 | Lee et al. | 257/99 |
| 2003/0151042 A1 | * | 8/2003 | Hueschen | 257/12 |
| 2005/0023549 A1 | | 2/2005 | Gardner et al. | 257/99 |

OTHER PUBLICATIONS

Physics of Semiconductor Devices, 2$^{nd}$ Edition, S.M. SZE, Tunnel Devices, Chapter 9, pp. 513-536. 1981. A Wiley-Interscience Publication.
Applied Physics Letters, vol. 78, No. 21, May 21, 2001, pp. 3265-3267, Jeon et al., "Lateral Current Spreading in GAN-Based Light-Emitting Diodes Utilizing Tunnel Contact Junctions."
Applied Physics Letters, vol. 79, No. 16, Oct. 15, 2001, pp. 2532-2534, Ozden et al., "A Dual-Wavelength Indium Gallium Nitride Quantum Well Light Emitting Diode."
Solid State Electronics, vol. 40, Nos. 1-8, 1996, pp. 241-244, Brehmer et al., "Resonant Tunneling Through Rare Earth Arsenide, Semimetal Quantum Wells."

(Continued)

*Primary Examiner* — Samuel Gebremariam
(74) *Attorney, Agent, or Firm* — Koppel, Patrick, Heybl & Philpott (57) ABSTRACT

A low resistance tunnel junction that uses a natural polarization dipole associated with dissimilar materials to align a conduction band to a valence band is disclosed. Aligning the conduction band to the valence band of the junction encourages tunneling across the junction. The tunneling is encouraged, because the dipole space charge bends the energy bands, and shortens a tunnel junction width charge carriers must traverse to tunnel across the junction. Placing impurities within or near the tunnel junction that may form deep states in the junction may also encourage tunneling in a tunnel junction. These states shorten the distance charge carriers must traverse across the tunnel junction.

21 Claims, 3 Drawing Sheets

OTHER PUBLICATIONS

IEEE Journal of Selected Topics in Quantum Electronics, vol. 8, No. 4, Jul./Aug. 2002, pp. 739-743, Jeon et al., "GAN-Based Light-Emitting Diodes Using Tunnel Junctions."

Applied Physics Letters, vol. 63, No. 26, Dec. 27, 1993, pp. 3613-3615, Richard et al., "High Current Density Carbon-Doped Strained-Layer GaAs (p+)-InGaAs(n+)-GaAs(n+)p-n TUNNEL Diodes."

American Physical Society Journal, Physics Review B, vol. 56, No. 16, Oct. 15, 1997, pp. R10024-R10027, Bernardini et al., "Spontaneous Polarization and Piezoelectric Constants of III-V Nitrides."

*Solid State Electronic Devices*, Pearson Education Inc., 6th Ed., 2006, Streetman et al., pp. 1-26.

\* cited by examiner

LOW RESISTANCE TUNNEL JUNCTIONS IN WIDE BAND GAP MATERIALS AND METHOD OF MAKING SAME

BACKGROUND OF THE INVENTION

1. Field of the Invention

The present invention relates to semiconductor devices formed in wide band gap materials, and in particular to fabricating low resistance tunnel junctions in wide band gap materials.

2. Description of the Related Art

Junctions between differently doped regions of a single semiconductor material are called homojunctions. These junctions are formed, for example, when a single material abruptly transitions from one type of doping to another. An abrupt transition is typically one where a value of merit (in this instance doping concentration) changes by more than one percent per monolayer.

A p-n homojunction consists of a p-type and an n-type section of the same semiconductor materials in metallurgical contact with each other. When n- and p-type semiconductors are brought into contact to form a junction, electrons and holes diffuse from areas of high concentration towards areas of low concentration. Thus, electrons diffuse away from the n-region into the p-region, leaving behind positively charged ionized donor atoms in the n-region. In the p-region, the electrons recombine with abundant holes. Similarly, holes diffuse away from the p-region, leaving behind negatively charged ionized acceptor atoms. In the n-region, the holes recombine with abundant mobile electrons. As a result of this diffusion, a narrow region on both sides of the contact becomes almost totally depleted of mobile charged carriers. This region is called the depletion layer. The thickness of the depletion layer in the junction is inversely proportional to the concentration of dopants in the region.

A p-n homojunction typically will act as a diode. A particular type of degenerately doped p-n homojunction forms a conventional tunnel diode. Tunnel diodes, first discovered by L. Esaki, are described in the Physics of Semiconductors 2d Ed, Sze, Wiley Interscience Publisher, 1981, Chapter 9, pages 513-536. Esaki observed, while studying degenerately doped germanium p-n junctions, an anomalous current voltage characteristic in the forward biased direction of the junction. Esaki explained this characteristic as being the result of quantum tunneling across the depletion region. The width of the depletion region was therefore called a tunnel distance, or tunnel width. Esaki observed, under slight bias, charge carriers tunneling across the depletion region of what would be an impenetrable p-n junction at that bias without the quantum tunneling.

A bias applied across a tunnel diode is required to sustain a net tunneling current and one may define the tunneling resistance as the bias divided by current. Under certain conditions, the tunneling resistance can be low enough that the tunnel diode current-voltage relationship is essentially ohmic (linear). Three primary factors determine the tunneling resistance: the density of free electrons on one side of the junction, the density of holes on the other side, and the tunneling probability. The higher the value of these parameters, the lower the tunneling resistance. While it is generally a complex function of the details of the tunnel junction, the tunneling probability decreases roughly exponentially with tunneling distance. Thus, tunneling resistance is reduced when the tunnel width is as small as possible.

The simplest tunnel diode comprises a p-n homojunction in which both p and n sides are uniformly and degenerately doped. The depletion region or tunnel width is inversely proportional to the square root of the charge carrier density (the number of charge carriers per cubic centimeter) of the materials used to form the junction, and directly proportional to the size of the material's band gap.

Degenerative doping of the materials that form the tunnel junction reduces the tunnel width across which the charge carriers need to tunnel. Unfortunately, there is an upper limit to how much this mechanism can reduce the tunnel width. All dopants eventually reach a saturation solubility limit at which the material is no longer capable of absorbing further dopants without changing its composition. Once this saturation limit is reached, doping loses its ability to reduce the tunnel width. Furthermore, as the charge density increases the dopant ionization probability decreases according to basic semiconductor statistics, again limiting the ability of doping to reduce the tunnel width.

Homojunction tunnel junctions may be fabricated in periodic table group III-nitride semiconductor materials. Such materials include, but are not limited to, indium nitride, gallium nitride and aluminum nitride, and combinations thereof. One difficulty with these nitride materials is that their band gap is significantly larger than the band gap of other III-V materials. For example, gallium nitride (a III-nitride semiconductor material) has a band gap of roughly 3.4 electron volts (eV), while gallium arsenide (a conventional III-V semiconductor material) has a band gap of approximately 1.4 electron volts. This band gap difference is significant, because a larger band gap results in a larger, or wider, tunnel width. A tunnel junction with low tunneling resistance is very difficult to form in wide band gap materials such as gallium nitride or silicon carbide.

SUMMARY OF THE INVENTION

The present invention seeks to reduce the tunnel junction width of a tunnel junction using a natural polarization dipole inherent in certain growth directions of polar semiconductor materials. A tunnel junction has first and second semiconductor layers, that are degenerately doped, and a third semiconductor layer having a composition different from the first and second layers. The third layer is sandwiched between, and in semiconductor junction contact with, the first and second layers, and together the three layers form a structure containing a tunnel junction. A natural dipole associated with the junction's dissimilar materials aligns a conduction band to a valence band so that the tunnel junction width is smaller than it would be without the third layer.

Tunneling through the band gap of a tunnel junction in a structure may be enhanced by the addition of impurities within the layers forming the structure, within or near the junction. The impurities may form band gap states that reduce the tunnel junction's resistance to tunneling.

A method to fabricate low resistance tunnel junctions makes novel use of polarization induced dipole charges to reduce the tunnel junction width. Impurity generated band gap states may also be used to reduce the resistance to tunneling across the tunnel junction.

BRIEF DESCRIPTION OF THE DRAWINGS

These and other features and advantages of the invention will be apparent to those skilled in the art from the following detailed description, taken together with the accompanying drawings, in which;

FIG. 1a is an illustrative sectional view of a known structure for a conventional tunnel junction;

FIG. 1b is a band gap diagram illustrating the energy bands corresponding to the device of FIG. 1a;

FIG. 2a is an illustrative sectional view of a device having a junction structure in accordance with an embodiment of the invention that generates a large polarization dipole;

FIG. 2b is an illustrative sectional view of a tunnel junction structure in accordance with an embodiment of the invention that generates a large polarization dipole;

FIG. 2c is a band gap diagram illustrating the energy bands corresponding to the device of FIG. 2a;

FIG. 3a is an illustrative sectional view of a structure similar to FIG. 2b but having an opposite polarization;

FIG. 3b is a band gap diagram illustrating the energy bands corresponding to the device of FIG. 3a;

FIG. 4a is an illustrative sectional view of a structure for introducing deep band gap states into a tunnel junction;

FIG. 4b is a band gap diagram illustrating the energy bands corresponding to the device of FIG. 4a;

FIG. 5a is an illustrative sectional view of a structure for introducing band gap states of varying depths to a tunnel junction;

FIG. 5b is a band gap diagram illustrating the energy bands corresponding to the device of FIG. 5a.

DETAILED DESCRIPTION OF THE INVENTION

The present invention is a low resistance tunnel junction structure in wide band gap materials. It will be understood, however, that the structures disclosed apply to semiconductor tunnel junction structures in general, where low resistance is desired but, in the absence of the present technique, unavailable. These junctions may be fabricated from groups III-V and II-VI compound semiconductors, whose crystal layers are grown normal to a polar direction of the crystal. In one embodiment, the tunnel junction structures are presumed to have the Wurtzite crystal structure with layers comprising gallium nitride GaN, indium gallium nitride $In_xGa_yN$, and aluminum gallium nitride $Al_xGa_yN$ where $0.3 \leq x \leq 1.0$ and $x+y=1.0$. In this embodiment, except where noted, the top surface of the crystal has a (0001) orientation with Periodic Table group III polarity.

In preferred embodiments, all of the layers are prepared by epitaxial growth methods, although it will be understood that appropriate growth or processing techniques could produce very similar structures. Material composition and doping are uniform over the epitaxial growth surface at any given time; but may vary in the direction of growth. Typically, these structures are grown by molecular beam epitaxy (MBE) or metal organic chemical vapor deposition (MOCVD), but other methods may also be used. An arrow in the accompanying figures indicates the direction of growth.

Figures 1A, 1B, 2A:
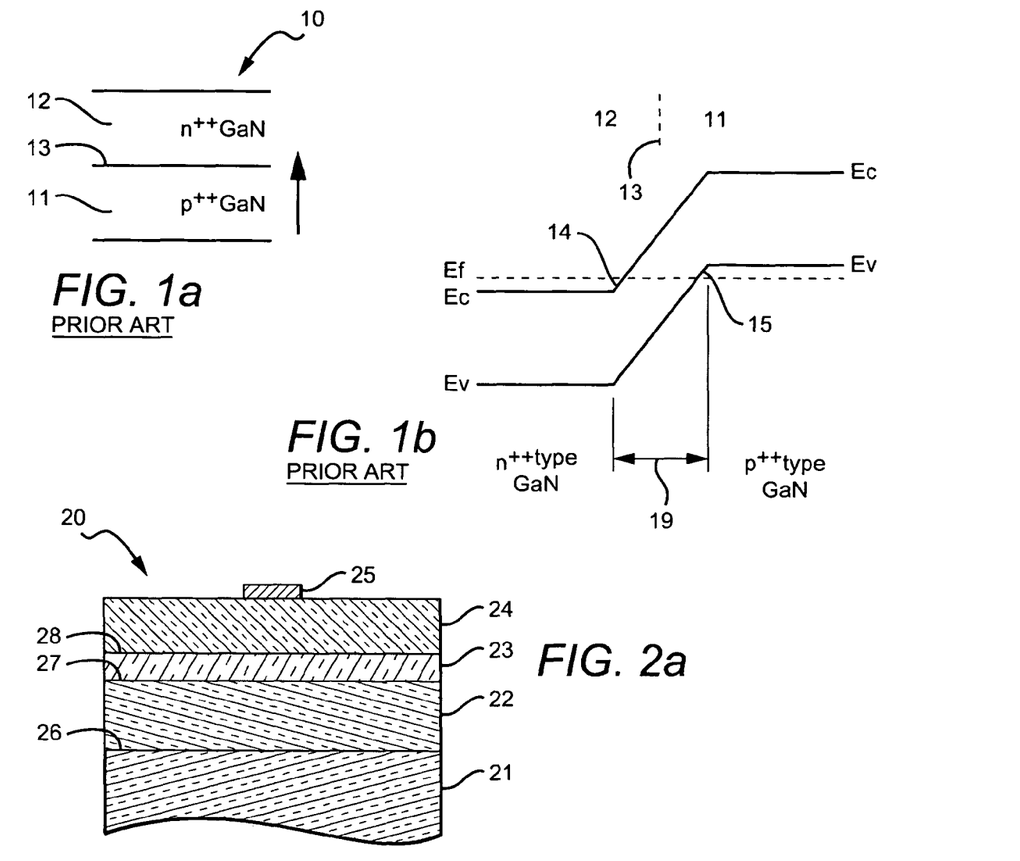

FIG. 1a shows conventional tunnel junction 10. The direction of growth is indicated by the arrow. It consists of degenerately doped p-type GaN layer 11. Upon which is grown a degenerately doped n-type GaN layer 12. As used herein, the term "degenerate" has its ordinary meaning for n-type GaN, i.e. a semiconductor material that has been extremely heavily doped with desirable impurities to give it an almost metal like ability to conduct current. As an example, degenerately doping an n-type layer of gallium nitride may result in a doping concentration of approximately $5 \times 10^{18}$ carriers per cubic centimeter (1/cm³). In the case of p-type gallium nitride, it is well known that it is not possible to achieve degenerate doping in the ordinary sense due to the unavailability of acceptor impurities with suitably low activation energy. Therefore "degenerate" in this case indicates very high doping concentrations approximately $>1 \times 10^{19}$ per cubic centimeter. However neither the term, "degenerate" nor the approximate doping levels mentioned here are intended to be limiting. Layers 11 and 12 are in homojunction contact 13 with one another. Layers 11 and 12 and contact 13 combine to establish a tunnel junction, and a depleted doping region at the interface of layers 11 and 12.

FIG. 1b shows that the conduction band (Ec) and the valence band (Ev) of p-type gallium nitride layer 11 lie above the Fermi energy level (Ef). While the conduction band and the valence band of n-type gallium nitride layer 12 lie below the Fermi level. Band bending can be seen to occur in this figure as the p-type bands bend down to join the n-type bands, and the n-type bands bend up to join the p-type bands. (For simplicity, and since all acceptors are ionized in the band-bending region in any case, the complication of incomplete ionization of acceptors in p-type GaN is ignored in FIG. 1b). In typical junctions, depletion region 19, also called the high field region, can be seen to extend partially into layer 11 and partially into layer 12. In tunnel junctions, this distance 19 is also referred to as the tunnel junction distance, or tunnel junction width. This is an indication of the distance a charge carrier will have to tunnel from position 14 in the conduction band of n-type material 12, across tunnel junction width 19, into position 15 in the valence band of the p-type material 11. It is this distance 19 that is to be reduced by manipulating the polarization of the semiconductor materials that make up the structure.

FIG. 2a shows one embodiment of the structure of device 20 which contains a low resistance tunnel junction. Device 20 is deposited on substrate 21. Substrate 21 may be formed from any semiconductor material. Typical substrates may be, but are not limited to, silicon carbide, GaN, and sapphire. In one embodiment, substrate 21 may be p-type GaN. In this embodiment, a first layer 22 of p-type GaN is deposited on substrate 21. An InGaN layer 23 is grown on layer 22. A n-type GaN layer 24 is grown on layer 23. Layer 24 has deposited on it a metal contact 25. Nucleation layer 26 is the transition between substrate 21 and first layer 22. Heterojunction 27 is where first layer 22 transitions into second layer 23. Junction 27 is a heterojunction, because layer 23 has a different composition from layer 22. Similarly, Junction 28 is a heterojunction. Device 20 contains a tunnel junction wherein a dissimilar material layer 23 is inserted at the junction between degenerately doped gallium nitride layers 22 and 24 to reduce the distance needed to tunnel across the tunnel junction by charge carriers.

Features have been added to this figure to provide a frame of reference. These features are not required to be where this embodiment places them. For example, it is not necessary for the tunnel junction of the invention to be located so close to either a metal contact layer 25 or a substrate 21. These features are merely provided to illustrate one embodiment of the invention. The novel features of this invention remain even when configured with additional semiconducting layers, that may or may not be active, between the invention and metal contact 25 or substrate 21.

Figures 2B, 2C:
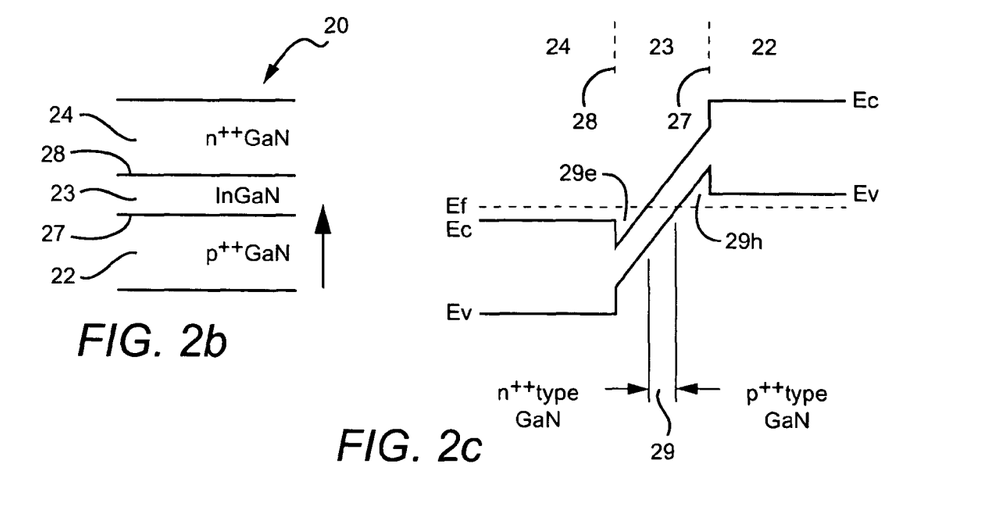

The structure shown in FIG. 2b focuses on the tunnel junction. The direction of growth is indicated by the arrow. In one embodiment, layer 22 is a typical degenerately doped p-type gallium nitride layer. Layer 23 is an indium gallium nitride layer grown on layer 22. Layer 24 is a typical degenerately doped n-type gallium nitride layer grown on layer 23.

In this embodiment layer 22 is grown before layer 24, and layer 23 is an indium gallium nitride layer between layers 22 and 24. Indium gallium nitride layer 23 may be approximately 30 to 100% indium, and between approximately 0.3 to 5 nanometers thick.

Polarization induced charges should be taken into account when considering the electrical characteristics of heterostructures grown on crystal polar surfaces. Crystal layers grown along the (0001) orientation in the case of Wurtzite gallium nitride, or along the (111) orientation in the case of the zinc-blend gallium arsenide, are two examples of crystal polar surfaces. The Bravais lattice of the Wurtzite structure is hexagonal, with the axis perpendicular to the hexagons usually labeled as the "c" axis or the (0001) orientation. Along this axis the structure can be thought of as a sequence of atomic layers of the same element (e.g. a layer of all gallium atoms followed by a layer of all nitrogen atoms on a surface), built up from regular hexagons. Due to this uniformity, each layer or surface is polarized and possesses either a positive or negative charge; this generates a dipole across the atomic layers. The charge state of each layer depends on its constituent atoms. Other examples of crystal planes with various growth directions may be found in Solid State Electronic Devices, 2nd Ed., Streetman, Prentice-Hall, Inc., 1980, p.1-24.

Polarization of the materials is related to the ionic strength of the bond within each of the materials. The phenomenon is discussed in a number of publications, including Bernardini et al, "Spontaneous polarization and piezoelectric constants of III-V nitrides," American Physical Society Journal, Physics Review B, Vol. 56, No. 16, 1997, pages R10024 to R10027. In a gallium nitride bond, the electrons have a slight preference for the nitrogen atom. This slight preference gives the gallium nitride bond a polarity. The gallium atom has a slight positive charge, and the nitrogen atom has a slight negative charge. Growing in a non-polar direction causes these charges to cancel each other out. A given surface will have approximately equal numbers of gallium and nitrogen atoms. Growing gallium nitride in the (0001) direction, however deposits layers of single element composition. Thus a layer with all nitrogen atoms and no gallium atoms will have a negative polarity, while a layer of all gallium atoms and no nitrogen atoms will have a positive polarity.

Gallium nitride has a certain ionic component to its crystal bond, and indium gallium nitride has a different ionic component to its crystal bond, which is further affected by the strain caused by placing the two materials adjacent to each other. Because of this difference, a space charge will develop at the interface of a heterojunction between these different materials. The space charge will essentially perform the same function as doping in a junction, bending the junction bands to reduce the tunnel width. Additionally, the magnitude of the space charge generated by this indium gallium nitride substitution is larger than what may be achieved by degenerate doping of a homojunction made from gallium nitride. This space charge tends to shrink the width of tunnel junction 29 (shown in FIG. 2c). The polarization dipole allows the conduction band on the n-type side of the junction 24 to line up to the valence band on the p-type side of the junction 22. This indium gallium nitride polarization dipole may achieve this effect over a very short distance.

Additionally, InN has a smaller band gap than GaN, and accordingly any InGaN compound semiconductor will have a smaller band gap than GaN. The greater the concentration of indium in the semiconductor, the smaller the band gap will be. A charge carrier tunneling across tunnel junction width 29 will be influenced by this difference in band gap. The reduction in the band gap height, and the polarization formed by the dissimilar material combine to reduce the resistance to tunneling across the tunnel junction by reducing the tunnel junction width and lowering the tunneling energy barrier.

In one embodiment, the distance a charge carrier must tunnel, shown in FIG. 2c, is from position 29e in the conduction band of n-type gallium nitride layer 24 to position 29h in the valence band in p-type gallium nitride layer 22 across tunnel junction width 29. The band bending formed by the space charge has shortened this distance across tunnel junction width 29 over what the distance would have been in the absence of layer 23. The space charge was a function of the polarization of the dissimilar materials from which the structure was grown.

Figures 3A, 3B:
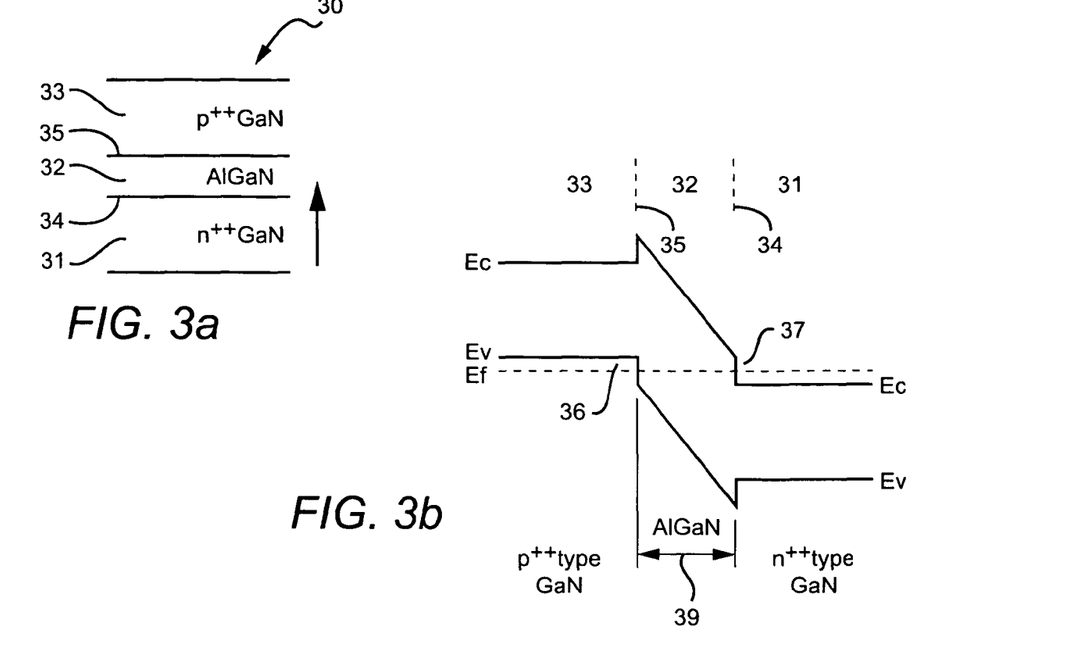

FIG. 3a is a structure of one embodiment of tunnel junction 30 wherein the first grown layer 31 of junction 30 was a degenerately doped n-type gallium nitride. Aluminum gallium nitride layer 32 is grown on layer 31. Degenerately doped p-type gallium nitride layer 33 is grown on layer 32 forming tunnel junction 30. Heterojunction 34 forms the transition between degenerately doped n-type gallium nitride layer 31 and aluminum gallium nitride layer 32. Heterojunction 35 forms the transition between aluminum gallium nitride layer 32 and degenerately doped p-type gallium nitride layer 33.

In this embodiment, degenerately doped n-type. gallium nitride layer 31 is grown first, and therefore is adjacent to a substrate (not shown) used to support the structure as it is grown. The direction of growth is indicated by the arrow. The junction polarity of the semiconductor layers in this figure is the opposite of that for the structure in FIG. 2b. Because of the junction polarity change involved in growing n-type gallium nitride layer 31 first, a different dissimilar material is required to be used in layer 32. Aluminum gallium nitride has an ionic component to its crystal bond that is different to gallium nitride, but opposite from indium nitride, and is therefore suitable for this purpose. The aluminum gallium nitride layer 32 may be between 30 to 100% aluminum, and approximately 0.3 to 5 nanometers thick. Heterojunctions 34 and 35 may be abrupt or graded based on empirical requirements of either the growth system or the electrical properties of the structure.

The thickness of layer 32 in FIG. 3a influences the width of tunnel junction 39 in FIG. 3b. The approximate locations of the physical structural elements of tunnel junction 30 with respect to the band gap diagram describing the electrical properties of the structure are displayed across the top of FIG. 3b. Tunnel junction width 39 is the distance the charge carrier has to tunnel from the conduction band of n-type gallium nitride layer 31 at position 37 across tunnel junction width 39 to position 36 in the valence band of the p-type gallium nitride layer 33. The space charge dipole associated with the aluminum gallium nitride layer 32 means the tunneling distance 39 is less than it would have been in the absence of layer 32. The space charge was a function of the polarization of the dissimilar materials from which the structure was grown.

Aluminum nitride has a larger band gap than gallium nitride. Aluminum nitride is generally credited with having a band gap of approximately 6.2 eV, where gallium nitride has a band gap of approximately 3.4 eV. The polarization dipole formed by the presence of the aluminum gallium nitride added to the junction of the gallium nitride tunnel junction will compete with the extra height of the band gap over that transitional area. The physical thickness of layer 32 will therefore, of necessity, be smaller than the physical thickness of layer 23, and the reduction in tunneling resistance will be less. However, it is experimentally possible to determine an optimum thickness for layer 32 that allows the polarity to reduce the width of tunnel junction 39 before the additional height of the band gap diminishes the polarization effect.

Figures 4A, 4B:
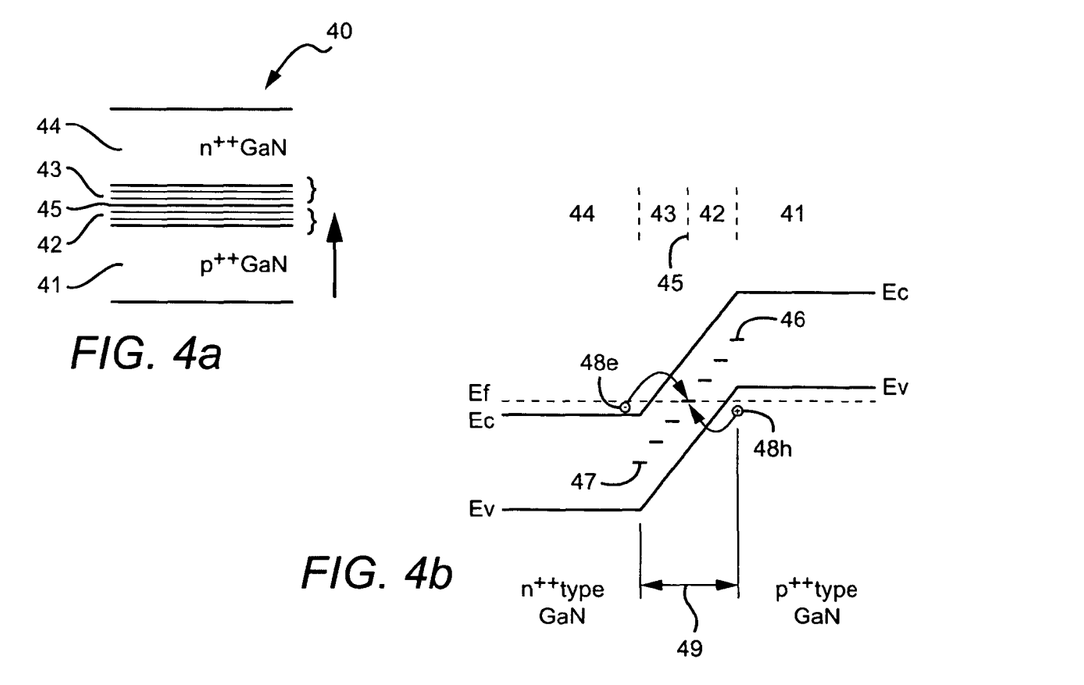

FIG. 4a is a sectional view of a structure of tunnel junction 40 wherein impurities that form mid band gap or mid gap states are introduced near the physical location of tunnel junction interface 45 during growth of the structure. The direction of growth is indicated by the arrow. Degenerately doped p-type gallium nitride layer 41 is grown first, therefore layer 41 is adjacent to the substrate, not shown, used to provide support to the structure. Normally the tunnel junction would be grown to completion when degenerately doped n-type gallium nitride layer 44 is grown in semiconductor junction contact on top of layer 41. However in one embodiment, as growing proceeds to near the end of the growth of layer 41, before transitioning to the growth of layer 44, impurities may be added to layer 41 to induce deep states in the band gap of the to be formed junction 40. These impurities are introduced into growth layer 41 at region 42. These impurities may be added continuously or they may be added in one or more atomic layers. The density of states should be such that they may be described as p+, or higher. The impurities in region 42 should be acceptor impurities so they do not interfere with the overall charge of layer 41.

Just after the transition from growing layer 41 to growing layer 44, region 43 may be grown transitioning into layer 44. Region 43 would be degenerately doped n-type gallium nitride with the addition of impurities, or controlling the growth condition of the junction, to add deep states into the band gap. The impurities and the deep states introduced into the band gap from region 43 should be donors, so as not to interfere with the charge of layer 44. The density of states should be such that they may be described as n+, or higher.

Once these impurities or defects have been grown into the interface region of layers 41 and 44, intermediate band gap states will be introduced into the high field region of the interface of the tunnel junction structure. This phenomenon is displayed in FIG. 4b, which is the band gap diagram of the above-mentioned structure. Homojunction 45 is the physical location in tunnel junction structure 40 where the polarity of the charge carriers is inverted. In layer 41, including region 42, majority charge carriers are holes. In layer 44, including region 43, majority charge carriers are electrons. Depending on the relative doping of the n-type and p-type layers in tunnel junction structure 40, a depletion layer centered on homojunction 45 extends a small way into both n-type and p-type layers.

In FIG. 4b, the conduction band and the valenceband of p-type GaN layer 41 can be seen bending to meet the conduction band and the valence bands of n-type GaN layer 44. Deep states 46, 47 may be seen across tunnel junction width 49. Acceptor deep states 46 may be seen in region 42 of tunnel junction width 49. Donor states 47 may be seen in region 43 of tunnel junction width 49. In one embodiment, rather than having to tunnel from the conduction band to the valence band a charge carrier, an electron 48e, may tunnel from the conduction band of n-type gallium nitride layer 44 to an intermediate deep state. In addition, a positive charge or hole 48h may tunnel from the valence band of p-type gallium nitride layer 41 to the same state. Charges 48e and 48h will recombine in effect generating a positive charge at the conduction band of layer 44, and a negative charge at the valence band of layer 41. By allowing charge carriers to meet at mid gap states to recombine, these deep states in effect shorten tunnel junction width 49 the charge carriers are required to cross.

In one embodiment, a variety of states may be added to the high field region of a tunnel junction during growth. Such an embodiment is displayed in FIG. 5a, which shows tunnel junction structure 50 where the direction of growth is indicated by the arrow. Degenerately doped p-type gallium nitride layer 51 is grown first. Layer 51 is grown most adjacent to a substrate, not shown, used to support junction structure 50. As the end of growth layer 51 approaches, region 52 having a particular type of impurity that will generate a deep mid gap state may be introduced near interface 54. After region 52 is grown, region 53 with an impurity that generates a slightly shallower mid gap state may be introduced to the material. After region 53 is grown, there is a carrier transition from p-type to n-type at junction contact 54 as layer 57 begins to grow. Region 55 of layer 57 has an impurity that generates a deep mid gap state donor deposited within it. Layer 56 has an impurity that generates a shallow mid gap state grown into it. Degenerately doped n-type gallium nitride layer 57 is grown after the above transition.

Figures 5A, 5B:
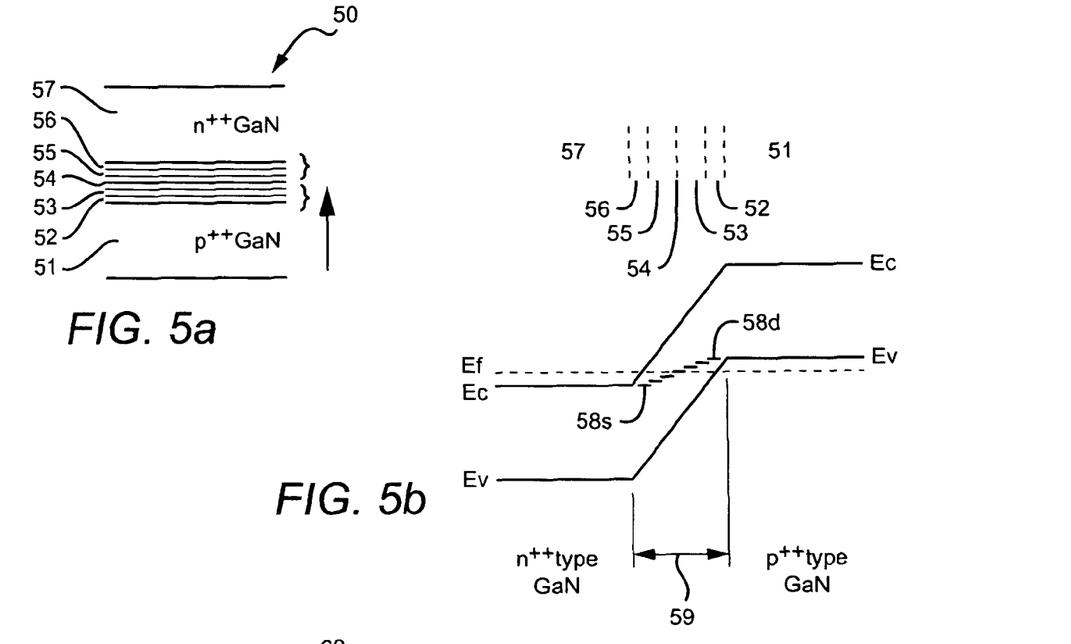

The band gap of the structure in FIG. 5a is shown in FIG. 5b. Growth layers 51-57 can be observed at the top of band gap structure. Deepest acceptor state 58d in tunnel junction width 59 may be observed just off the valence band in p-type region 52. The shallowest donor state 58s may be observed just off the conduction band in n-type region 56. A range of different impurities and states can be introduced to provide a quasi-continuous staircase across the tunnel junction. This quasi-continuous staircase could be most ideally likened to a metal transition. The conduction of carriers across this tunnel junction will be almost metal like. Mid gap states introduced into the high field region or tunnel junction width 59 should have concentrations such that they may be described as either n++ or p++ to get the maximum benefit, and prevent saturation effect at high current. Saturation affect would occur when all the available states are taken up by current tunneling across the gap leaving excess current unable to tunnel.

Figure 6A:
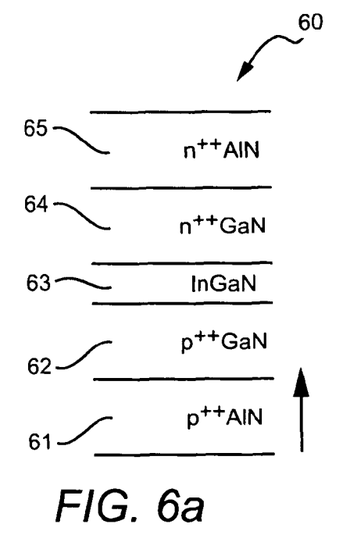
FIG. 6 is a band gap diagram illustrating the energy bands of a device similar to that seen in FIG. 2 further including a resonant tunneling cavity to enhance the tunneling probability further.

The tunneling probability of these tunneling junctions may be increased by confining charge carriers to 2-dimensional states on either side of the junction. Confinement barriers may be fabricated from semiconductor materials having larger band gaps than the material in which they confine charges. FIG. 6a shows one embodiment of a structure intended to create a resonance tunneling cavity to increase tunneling probability. The direction of growth is indicated by the arrow. In one embodiment, layer 61 may be a degenerately doped p-type AlN layer forming a confinement barrier. Layer 62, a typical degenerately doped p-type gallium nitride layer, is grown on layer 61. Layer 63 is an indium gallium nitride layer grown on layer 62. Layer 64 is a typical degenerately doped n-type gallium nitride layer grown on layer 63. Layer 65 may be a degenerately doped n-type AlN layer, grown on layer 64, forming a second confinement barrier. Confinement barriers 61 and 65 having larger band gaps than layers 62-64 confine charge carriers in the vicinity of layer 63.

Figure 6B:
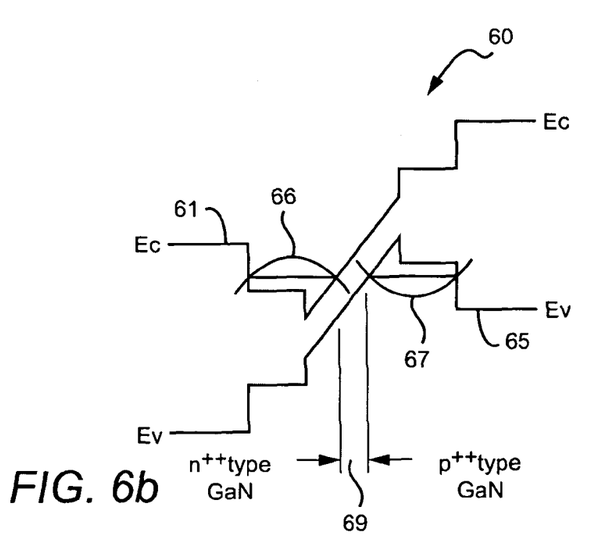

FIG. 6b displays the band diagram of one embodiment of such a resonant tunneling cavity added to a tunnel junction shown in FIG. 6a. Confinement barrier 61 confines electrons in 2-dimensional state 66 near tunnel junction 69. Confinement barrier 65 similarly confines holes in 2-dimensional state 67 near tunnel junction 69. The charge carriers confined in states 66 and 67 have a higher probability of tunneling across junction 69, because they are coupled across tunnel junction 69 in resonance.

In one embodiment, the method used to reduce the width of a tunnel junction may be described as the following. A polarization charge may be generated in a crystal lattice at a tunnel junction. A tunnel junction width that is smaller than the width that would form in the absence of said charge is formed.

The polarization charge may be provided by the presence of materials having different polarization charges. The dissimilar material used to generate the charge may be placed at the junction during growth. Growth of these structures typically is performed by MBE or MOCVD, however other methods of structure fabrication may be used. Growth conditions optimized for GaN are usually significantly different from optimal growth conditions for InGaN, or AlGaN. Transitions in the growth conditions from one material to another must be handled with care, as there may be an intermediary period when conditions are such that neither material will grow high quality crystals.

The fraction of In or Al in the composition of the dissimilar materials may be from 30 to 100%. The larger the fraction of dissimilar material in the junction, the greater the polarization effect on the tunnel junction. However, the higher the fraction of dissimilar material there is, the more difficult it is to grow that material.

In one embodiment, growth may be interrupted while new growth conditions stabilize. Abrupt interfaces at these heterojunctions provide narrow junctions with steep gradients. However, the material interface is subject to contamination deposition at the surface during growth interruptions.

In one embodiment, composition transitions are ramped during changes in growth conditions. This stretches the dipole effect over greater distances, reducing the impact it has on band bending. The weakened band bending caused by the ramped transitions, results in less shortening of the tunnel junction.

The width of the tunnel junction may also be reduced by the incorporation of impurities near the interface between the p-type material and the n-type material. An impurity is introduced at or near a tunnel junction that generates a band gap state within a tunnel width. A tunnel junction width having a resistance to tunneling that is smaller than the resistance that would form in the absence of said impurity is formed.

The impurities may be placed at the junction during growth. These impurities may be deposited by continuous doping or delta doping. The possible approaches to providing the band-gap states during growth include, but are not limited to: native defects, dislocations, metallic or semi-metallic islands, rare earth impurities, metal ions, and possibly ion implantation or diffusion.

Growing under non-equilibrium conditions may encourage the formation of native defects or dislocations. Defects or dislocations have the same effect as impurities in that they interrupt the crystal lattice, generating charge carriers. In one embodiment, the formation of defects may be encouraged by growing at a temperature that is too low to grow high quality crystals.

Metallic or semi-metallic impurities in the epitaxial growth may form what are called two-dimensional islands. As growth proceeds, small amounts of these elements or compounds may be introduced to the growth surface. These will agglomerate to form small patches of dissimilar material that resemble islands. The dissimilar materials will not affect the large-scale composition of the material, because there is not enough of the material to form layers that cover the growth surface. Examples of these island-forming metals include, but are not limited to: tungsten (W) and erbium nitride (ErN).

Band gap states may be formed by the presence in the semiconductor material layers of substitution impurities. Substitution impurities include, but are not limited to, rare-earth impurities and metal atoms. These impurities take the place of a Ga or N atom in the crystal lattice. When these impurity atoms have a different work function for their valence electrons than the atom they whose place they take, they may create a band gap state. Examples of rare-earth impurities include, but are not limited to: erbium Er, scandium Sc and europium Eu. Examples of metal atom impurities include, but are not limited to: platinum Pt, palladium Pd, zinc Zn and iron Fe.

For junctions sufficiently close to the surface of a device, it may be possible to introduce band gap states after growing the junction, by using implantation or diffusion. Implantation uses high-energy beams of ions to bury impurities into the crystal lattice of a junction. Implantation may be able to place ions in the region of the junction. The implantation damages the lattice, which has to be annealed to remove the lattice damage. While the lattice is repairing itself during this anneal, the ions move into substitution positions, activate and generate deep states. Impurity diffusion may be accomplished, by trapping the diffusing ion at the surface of the device. At elevated temperatures, the ions will diffuse into the crystal lattice. Diffusing into the junction area, and substituting for lattice atoms allows the diffusion atoms to generate deep states in the band gap.

Although the present invention has been described in considerable detail with references to certain preferred configurations thereof, other versions are possible. Therefore, the spirit and scope of the claims should not limited to the preferred version contain therein.

We claim:

1. A low resistance tunnel junction structure, comprising:
    first and second semiconductor layers, said first layer being degenerately doped n-type such that its Fermi level is located in or near its conduction band, and said second layer being degenerately doped p-type such that its Fermi level is located in or near its valence band;
    a metal contact forming a junction with one of said first layer or second layer, and a substrate forming a junction with the other one of said first layer or second layer;
    a third semiconductor layer having a dissimilar composition from said first and second layers sandwiched between, in contact with and forming first and second heterojunction contacts with said first and second layers respectively; and
    said first, second and third layers establishing a tunnel junction and having an associated natural polarization dipole that aligns said first layer's conduction band to said second layer's valence band so that the tunnel junction width is smaller than it would be in the absence of said third layer.

2. The junction structure of claim 1, wherein said third layer is approximately 0.3 to 5 nanometers thick.

3. The junction structure of claim 1, wherein said structure comprises a periodic table group III-nitride material system.

4. The junction structure of claim 1, wherein said third layer forms abrupt transitions with said first and second layers.

5. The junction structure of claim 1, wherein said third layer forms graded transitions with said first and second layers.

6. The junction structure of claim 1, further comprising:
    an electron barrier in said first layer of highly doped n-type GaN spaced from said junction, and a hole barrier in said second layer of highly doped p-type GaN spaced from said junction.

7. The junction structure of claim 1, wherein said metal contact forms a junction with said first layer, and said substrate forms a junction with said second layer, said first and second layers respectively comprising highly doped n-type gallium nitride (GaN) and highly doped p-type GaN.

8. The junction structure of claim 7, wherein said third layer comprises indium gallium nitride.

9. The junction structure of claim 1, wherein said substrate forms a junction with said first layer, and said metal contact forms a junction with said second layer, said first and second layers respectively comprising highly doped n-type gallium nitride (GaN) and highly doped p-type GaN.

10. The junction structure of claim 9, wherein said third layer comprises aluminum gallium nitride ($Al_xGa_yN$), where $x+y=1$.

11. The junction structure of claim 1, further comprising:
an impurity in the vicinity of said third layer that forms a band gap state that reduces the width of said tunnel junction.

12. The junction structure of claim 11, wherein said band gap state forms at least one intermediate state that provides tunneling targets between said conduction and valence bands.

13. A low resistance tunnel junction structure comprising:
a first layer of a first material having a first type of doping such that its Fermi level is in or near a first energy band, wherein said first layer is degenerately doped with said first type of doping,
a second layer of a second material in semiconductor junction contact with said first layer,
a third layer of said first material having a second type of doping such that its Fermi level is in or near a second energy band in semiconductor junction contact with said second layer, wherein said third layer is degenerately doped with said second type of doping, said first, second and third layers establish a tunnel junction and having an associated polarization dipole generated by the presence of said second layer that aligns said first layers said first band to said third layers said second band and forms a tunnel junction width that is smaller than it would be in the absence of said second layer; and
a metal contact forming a junction with one of said first layer or second layer, and a substrate forming a junction with the other one of said first layer or second layer.

14. The junction structure of claim 13, wherein said second layer is approximately 0.3 to 5 nanometers thick.

15. The junction structure of claim 13, wherein said second layer forms abrupt transitions with said first and third layers.

16. The junction structure of claim 13, wherein said second layer forms graded transitions with said first and third layers.

17. The junction structure of claim 13, wherein said structure comprises a periodic table group III-nitride material system.

18. The junction structure of claim 17, further comprising:
a fourth layer of said first material having said second type of doping in semiconductor junction contact with and supporting said third layer, wherein said first layer is a n-type GaN layer, said third layer is a p-type GaN layer, and said second layer is a $In_xGa_yN$ layer, where $x+y=1$.

19. The junction structure of claim 17, further comprising:
a fourth layer of said first material having said second type of doping in semiconductor junction contact with and supporting said third layer wherein said first layer is a p-type GaN layer, said third layer is a n-type GaN layer, and said second layer is a $Al_xGa_yN$ layer, where $x+y=1$.

20. The junction structure of claim 13, further comprising:
an impurity in the vicinity of said second layer that forms a band gap state that reduces the width of said tunnel junction.

21. The junction structure of claim 20, wherein said impurity forms at least one intermediate state that provides tunneling targets within said tunnel junction.

\* \* \* \* \*